United States Patent [19]

Kluitmans et al.

[11] Patent Number: 5,005,178
[45] Date of Patent: Apr. 2, 1991

[54] LASER DIODE MODULE

[75] Inventors: Johannes T. M. Kluitmans; Hindrik Tjassens, both of Eindhoven, Netherlands

[73] Assignee: U.S. Philips Corp., New York, N.Y.

[21] Appl. No.: 523,308

[22] Filed: May 11, 1990

Related U.S. Application Data

[63] Continuation of Ser. No. 425,375, Oct. 17, 1989, abandoned, which is a continuation of Ser. No. 297,796, Jan. 17, 1989, abandoned.

[30] Foreign Application Priority Data

Jan. 22, 1988 [NL] Netherlands .................... 8800140

[51] Int. Cl.$^5$ .............................................. H01S 3/045
[52] U.S. Cl. ......................................... 372/36; 357/74; 372/38
[58] Field of Search ...................... 372/36, 38; 357/74, 357/81; 333/32

[56] References Cited

U.S. PATENT DOCUMENTS 4,802,178 1/1989 Ury ........................................ 372/36
4,803,689 2/1989 Shibanuma ............................ 372/36

OTHER PUBLICATIONS

"Dual-In-Line Laser Diode Module for Fiber-Optic Transmission Up to 4 GBIT/S", Journal of Lightwave Technology, vol. LT-5, No. 10, Oct. 1987, pp. 1403-1411.

Primary Examiner—James W. Davie
Attorney, Agent, or Firm—William L. Botjer

[57] ABSTRACT

A laser diode module comprises a rectangular, box-like metal casing having a bottom (B), whereas an even number of guide pins (1-14) are passed through the bottom (B) in a standardized DIL order and no less than one guide pin (5) is electroconductively connected to the bottom (B). In addition to the laser diode (LD) itself the module further includes a Peltier cooler (TEC) and a thermal metal base carrier (BC) coupled thereto, which base carrier accommodates the laser diode (LD), a photodiode (PD), a support (S) for the glass fibre (F) and a thermistor (TH). In order to render this laser diode module suitable for use in communication systems with bit rates that exceed by far 1 Gbit/s, the said guide pin (5) has inside the casing a portion in the form of a rod with a constant cross-section and with no less than one flat side face which over its entire surface has an electroconductive coupling with the relevant long sidewall (SW$_1$) of the casing, an electroconductive interconnecting strip being provided between the head face of the rod and the base carrier (BC).

19 Claims, 5 Drawing Sheets

FIG. 6

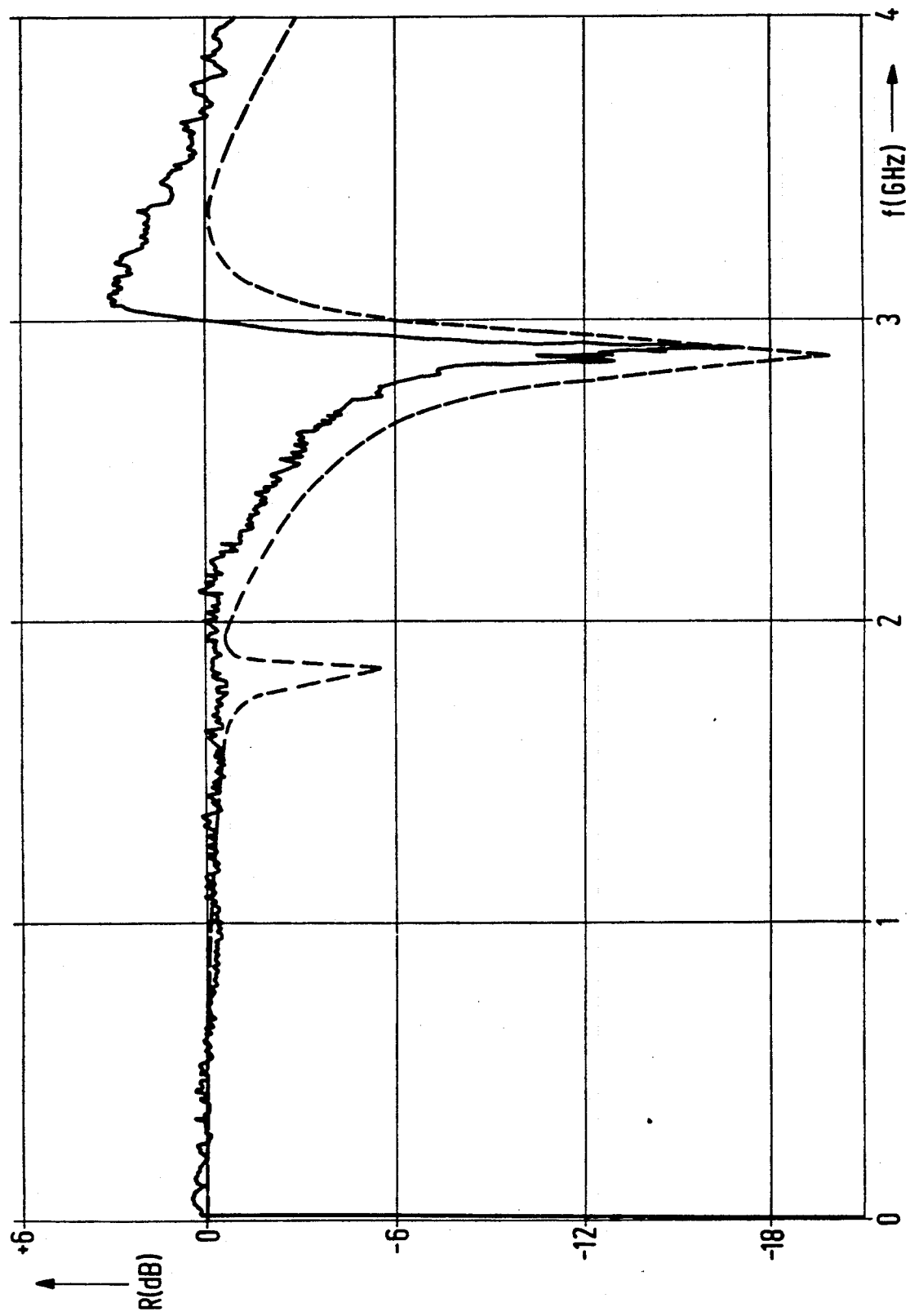

LASER DIODE MODULE

This is a continuation of application Ser. No. 425,375, filed Oct. 17, 1989, now abandoned which is a continuation of Ser. No. 297,796 filed Jan. 17, 1989 now abandoned.

BACKGROUND OF THE INVENTION

The invention relates to a laser diode module comprising:
a rectangular box-like metal casing with a bottom, two long and two short sidewalls, a tubular passage for a glass fibre being provided in one of the short sidewalls, and no less than eight guide pins being passed through the bottom in a standardized DIL-order, no less than one of the guide pins being inserted in the bottom by means of electrically conducting material and the remaining guide pins being inserted in the bottom by means of feedthrough insulators;
a thermoelectric cooler having two thermal contact pads, one contact pad being thermoconductively coupled to the bottom of the metal casing;
a plate-formed metal base carrier which is thermoconductively connected to the other thermal contact pad of the thermoelectric cooler, this base carrier accommodating:
a first sub-carrier with a laser diode attached,
a second sub-carrier with a photodiode attached,
a support for arranging the glass fibre such that its end is facing the front facet of the laser diode, and
a thermistor thermally coupled with the base carrier; and
connecting lines for electrically connecting the laser diode, the photodiode, the thermistor, the thermoelectric cooler and the metal base carrier to the respective guide pins.

In optical communication systems laser diode modules are used for electro-optical conversion of the electrical data signals to be transferred, whilst there is already widespread use of systems with data bit rates of 140, 280 and 565 Mbit/s. In the 565 Mbit/s systems a laser diode module with the configuration described in the preamble has become a de facto standard. In addition to the laser diode and the end of the glass fibre coupled thereto this standard module comprises a thermoelectric cooler, a thermistor and a photodiode facing the rear facet of the laser diode, which are used for monitoring and stabilizing the temperature and the delivered optical power of the laser diode.

In the field of optical communication there is a trend towards strongly increasing bit rates in the short term, according to which trend systems having a bit rate of 2.4 Gbit/s are already being developed. At these increasing bit rates it turns out that from approximately 1 Gbit/s onwards not so much the laser diode itself, but rather the laser diode module as a whole forms a constraining factor, so that not only the thermal and mechanical characteristics of the module should be given consideration to but also its electrical characteristics for higher frequencies. Specifically the rather large dimensions of the technically available thermoelectric coolers and the relatively large length of several connecting wires to the guide pins play an important role in this matter. A possible solution is redesigning the laser diode module as a whole for bit rates exceeding 1 Gbit/s and modifying in this new design the dimensioning of the casing and the order in which the guide pins are fed through the casing so that the electrical characteristics for higher frequencies are more favourable than with the standard module. The solution is not only costly, but also accompanied with the disadvantage that the printed circuit board accommodating the electric circuit elements to be connected to the laser diode module has to be redesigned, since the connecting points for the guide pins of the module can in that case no longer be selected according to a standardized DIL order.

SUMMARY OF THE INVENTION

It is an object of the invention to provide a laser diode module having the configuration described in the preamble and, specifically, a standardized DIL order of the guide pins, which module is suitable for use in systems operating at bit rates exceeding by far 1 Gbit/s, by means of a simple modification of the casing.

The laser diode module according to the invention is characterized in that no less than one of the guide pins, electroconductively connected to the bottom, has a portion located inside the casing which portion has the form of a rod, which over its entire length is electroconductively connected to the associated long sidewall of the casing, an electroconductive coupling being provided between the head face of the rod and the base carrier.

The invention is based on the recognition that the length of the guide pin portions situated inside the casing and the length of several connecting wires result in relatively high inductances and that the coupling between these inductances and the parasitic reactances of the thermoelectric cooler provokes undesired resonances, but also that the influence of the thermoelectric cooler can be considerably reduced by considerably reducing only the inductance of the connection between the casing and the base carrier of the laser diode module in the way described hereinbefore.

Furthermore, the length of the rod can advantageously be chosen to be substantially equal to the distance between the bottom of the casing and the top of the base carrier, because in that case a relatively short electrical connection between the head face of the rod and the base carrier will suffice. The inductance of this connection between the head face of the rod and the base carrier can still be further reduced by choosing the largest dimension of the rod in the direction perpendicular to the relevant sidewall somewhat smaller than the distance between this sidewall and the facing side of the base carrier and bridging the interstice developed thus by a relatively wide connecting strip.

The rod preferably has a substantially rectangular cross-section so that it can easily be connected to the relevant sidewall. The width of the flat side face of the rod which is connected to this sidewall is substantially equal to the smallest distance between two consecutive further guide pins in a line of the DIL order so as to avoid undesirable couplings between the rod and adjacent guide pins.

BRIEF DESCRIPTION OF THE DRAWINGS

The invention and its advantages will now be further explained on the basis of an embodiment with reference to the drawing figures, in which.

FIG. 8 shows a frequency diagram to illustrate the small signal response of the laser diode module of FIG. 6.

DETAILED DESCRIPTION OF THE PREFERRED EMBODIMENTS

Figure 1:
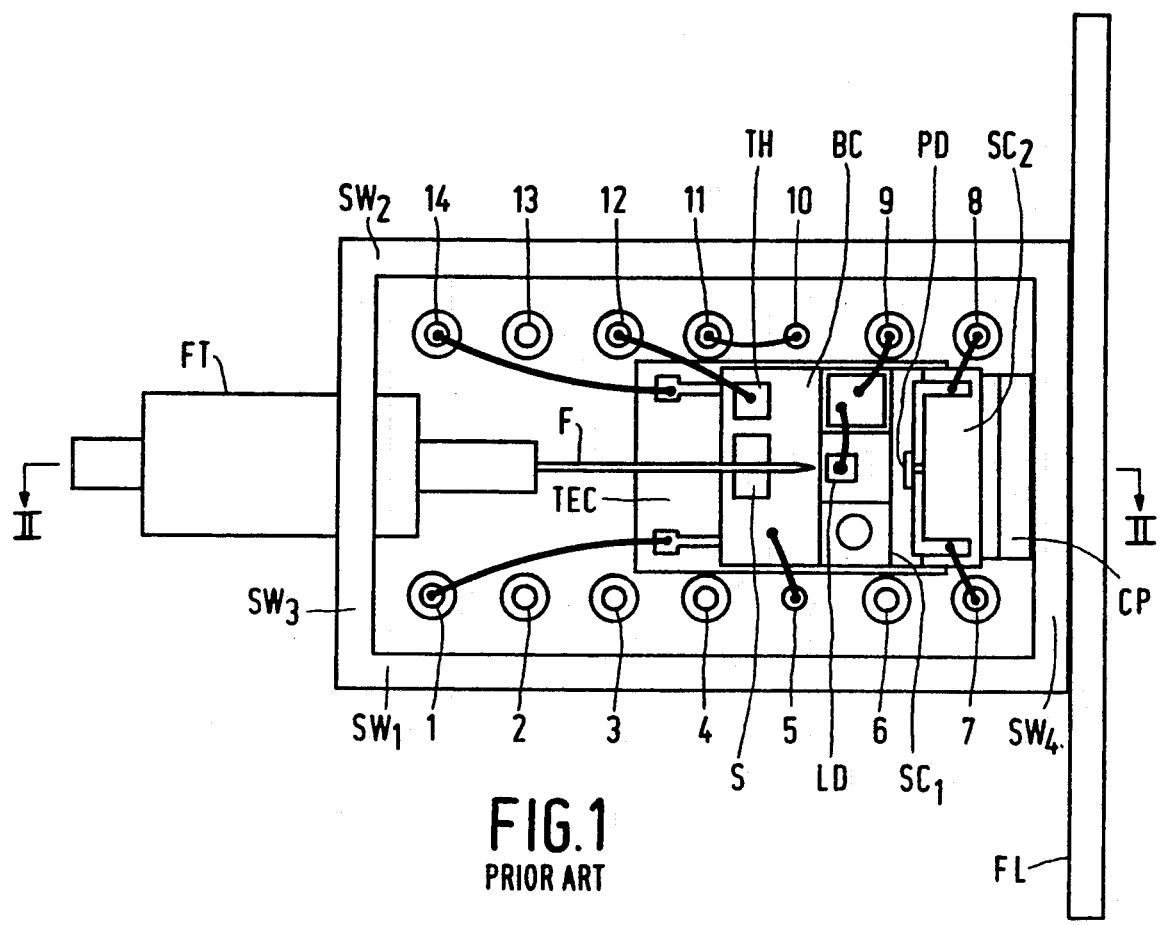
FIG. 1 shows a top view of a laser diode module according to the state of the art.
Figure 2:
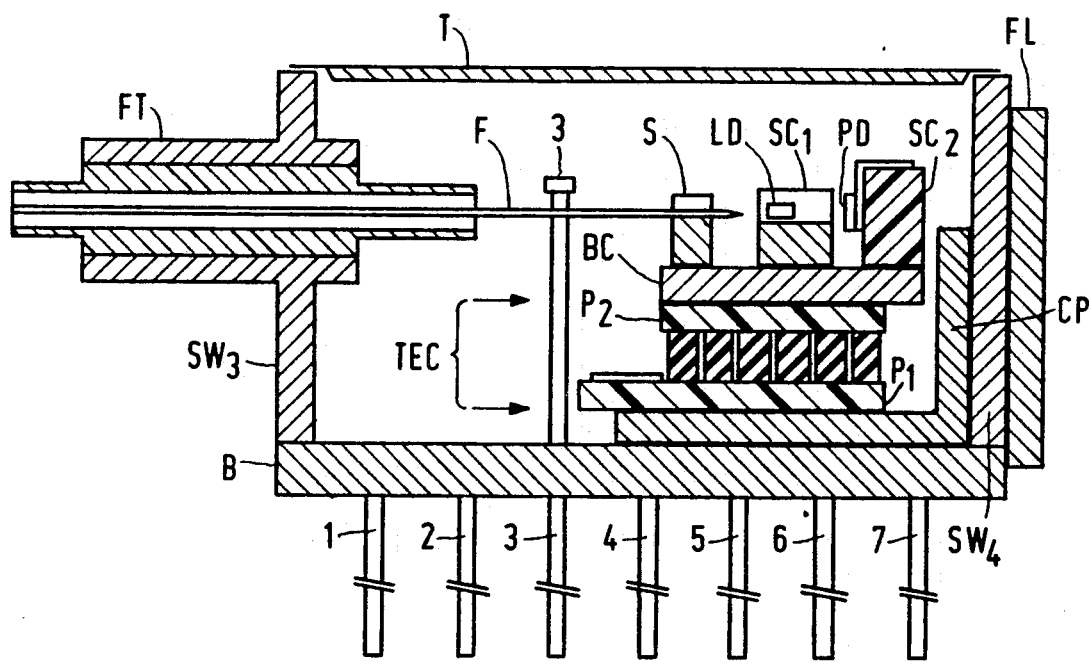
FIG. 2 shows a cross-sectional view of the same laser diode module along the line II—II in FIG. 1.

In optical communication systems for electrical data signals having a bit rate of 565 Mbit/s, a laser diode module is utilized which is represented in a somewhat simplified form in FIG. 1 and FIG. 2, whereas FIG. 1 shows a top view and FIG. 2 a cross-sectional view along the line II—II. The module shown in FIG. 1 and FIG. 2 is used on such a large scale that this module can be considered a de facto standard.

This module comprises a rectangular box-like metal casing with a bottom B, two long sidewalls $SW_1$, $SW_2$ and two short sidewalls $SW_3$, $SW_4$, which casing can be closed by a lid T also made of metal. In the short sidewall $SW_3$ there is provided a tubular passage FT for a glass fibre F, whereas the inner tube and the outer tube thereof are represented in FIG. 2 in diagrammatic outline. Fourteen guide pins 1-14 are passed through the bottom B in a standardize DIL order (Dual-In-Line), whereas the spacing of the centres of the pins in a line (1-7), (8-14) is fixed at 0.1 inch and the spacing of the lines (1-7), (8-14) is fixed at 0.3 inch, also measured between the centres of the pins. No less than one of the pins 1-14 is inserted in the bottom B by means of electroconductive material and in practice this usually applies to the pins 5 and 10. The remaining pins 1-4, 6-9 and 11-14 are inserted in the bottom B by means of feedthrough insulators for which glass is generally used. These insulators are indicated in FIG. 1 by means of circles round the pins 1-4, 6-9 and 11-14.

This module further includes a thermoelectric cooler TEC which in this embodiment is formed by a Peltier cooler with a base plate $P_1$ and a top plate $P_2$ of ceramic material which properly conducts thermally, but insulates electrically. Between these plates $P_1$, $P_2$ rod-like elements of a semiconducting material are inserted operating as p-n junctions and being connected in series by means of guide tracks on the top side of the base plate $P_1$ and the bottom of the top plate $P_2$. This series arrangement of p-n junctions is electrically connected between the pins 1 and 14 by means of connecting wires which are indicated in FIG. 1—as are the remaining connecting wires of the module—in bold lines. The bottom of the bottom plate $P_1$ forms a thermal contact face of the thermoelectric cooler TEC, which is thermoconductively coupled to the bottom B of the casing via an L-shaped cooling plate CP which is thermoconductively connected to the bottom B and the short sidewall $SW_4$ of the casing to which a flare FL is attached, for the mechanical and thermal coupling of the module, to a larger cooling element which is not shown any further in FIG. 1 and FIG. 2. The top of the top plate $P_2$ like-wise forms a thermal contact face which is thermoconductively connected to a plate-formed metal base carrier BC.

On the metal base carrier BC a first sub-carrier $SC_1$ for a laser diode LD is installed. FIG. 1 and FIG. 2 show a current design of this sub-carrier $SC_1$ having a U-shaped profile of the cross-section along a vertical line in FIG. 1. This U-shaped profile is composed of an L-formed metal constituent part which is electroconductively connected to the base carrier, and a spacer of electro-insulating material (for example $Al_2O_3$) whose top accommodates an electrical contact pad. The laser diode LD is arranged on the L-shaped metal part of the sub-carrier $SC_1$, whereas its anode is electroconductively connected to this metal part. The cathode of laser diode LD is connected via a connecting wire to the electrical contact pad on the insulating spacer and this contact pad in turn is connected to pin 9 via a connecting wire.

On the metal base carrier BC is also installed a second sub-carrier $SC_2$ for a photodiode PD. The sub-carrier $SC_2$ is composed of insulating material (for example $Al_2O_3$) accommodating two guide tracks for electrically connecting the photodiode PD to the pins 7 and 8 by means of wires. The photodiode PD is arranged on the side face of sub-carrier $SC_2$ in a manner such that the photodiode PD faces the rear facet of the laser diode LD on sub-carrier $SC_1$ and receives a light beam emerging from this rear facet.

In addition, on the metal base carrier BC a support S is realised for arranging the glass fibre F in a manner such that its end faces the front facet of the laser diode LD. The way of arranging the glass fibre F on support S and the way of coupling the end of glass fibre F to the front facet of laser diode LD are of minor importance to the present invention and are therefore not shown any further.

Finally, on the metal base carrier BC a thermistor TH is arrangedd which is thermally coupled to this base carrier. One end of thermistor TH is electrically connected to pin 12 by means of a connecting wire and the other end is in this case also electroconductively connected to the metal base carrier BC.

The metal base carrier BC itself is electrically connected to pin 5 by means of a connecting wire. Since pin 5 is electroconductively connected to the metal bottom B of the casing and since the same applies to pin 10, pin 11 can in that case be utilized for the electrical connection of the second end of thermistor TH by interconnecting pins 10 and 11 by means of a wire.

The above description has shown that the laser diode LD and the thermistor TH both have a proper thermal coupling to the top plate $P_2$ on the Peltier cooler TEC, so that the temperature of the laser diode LD can be monitored and stabilized in a manner known per se. The mean optical power delivered by the laser diode LD to the glass fibre F can also be monitored and stabilized in a manner known per se by means of the photodiode PD which pulls in the light beam emerging from the rear facet of the laser diode LD. The electric circuits that are used for these two monitoring and stabilization processes are of minor importance to the present invention and are therefore not discussed any further, the more so because the circuits are widely known. On the other hand, it is certainly of importance how the electric circuit elements are connected to the guide pins 1-14 of the laser diode module as shown in FIG. 1 and FIG. 2. In practice this module is arranged on one side of a printed circuit board and the guide pins 1-14 protruding from the board are connected to guide tracks on the other side of the board which lead to the electric circuit elements to be connected to the module. The connecting points for the guide pins 1-14 on the printed circuit board thus have the same standardized DIL order as these pins 1-14.

If the described laser diode module is used for optical communication systems having bit rates exceeding 565 Mbit/s, it appears that from a bit rate of approximately 1 Gbit/s not so much the laser diode LD, but rather the laser diode module as a whole forms a constraining factor for the performance. This implies that attention should not only be given to the thermal and mechanical characteristics of the module, but also to its electrical characteristics for higher frequencies. As already shown in FIG. 1 and FIG. 2, it appears that the relatively large dimensions of the Peltier cooler TEC and the consequent relatively large length of the portions of the guide pins 1-14 located inside the casing (compare FIG. 2, showing this portion only for pin 3 for clarity), as well as the length of several connecting wires to these guide pins 1-14, play an important role in the electrical behaviour of the module for higher frequencies.

Figure 3:
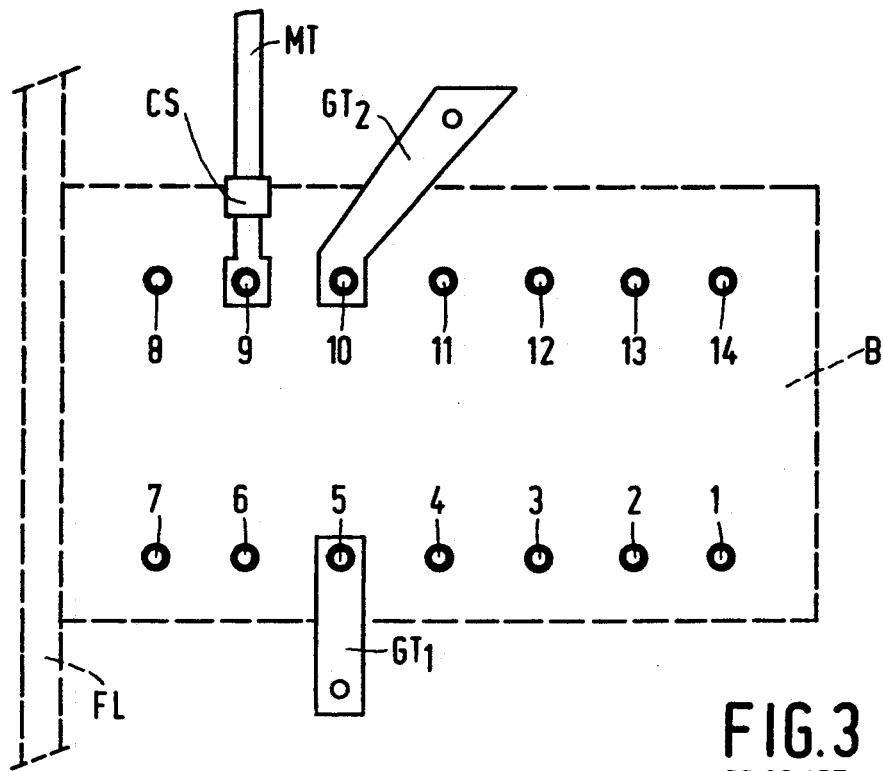
FIG. 3 shows a top view of a special printed circuit board which is used for measuring the high-frequency electrical properties of the laser diode module of FIG. 1.

Extensive examination of the cause of the declining performance at higher bit rates has led the Applicants to conclude that the high-frequency electrical behaviour of a laser diode module itself can be determined by arranging this laser diode module in a socalled free environment, which is to say that the laser diode module according to FIG. 1 is installed on one side of a printed circuit board on which on the other side only the guide tracks for the electrical connection of the laser diode LD itself are arranged. FIG. 3 shows a top view of this special printed circuit board with guide tracks $GT_1$ and $GT_2$ for connecting the pins 5 and 10 which are connected to the bottom B of the module, and a guide track MT for connecting the pin 9 which is connected to the cathode of the laser diode LD. In FIG. 3, in dashed lines, is shown how the module is attached to the bottom of this special printed circuit board, but not how the flare FL of the module is coupled thermally and mechanically to a relatively large-volume cooling body. In FIG. 3 is also represented how the guide tracks $GT_1$ and $GT_2$ comprise connecting points for a feedthrough to the conductive layer covering the bottom side of this board with the exception of the vicinity of the module-bottom B, but this layer itself is not represented. In FIG. 3 guide track MT together with the conductive layer at the bottom forms a microstrip line having a characteristic impedance of 50 ohms. In order to attain a reasonable coupling between this laser diode module and this microstrip line, the printed circuit board in FIG. 3 comprises a so-called chip resistor CS for surface mounting by means of which the guide track MT is connected to the connecting point for pin 9 of the module.

By means of the printed circuit board described hereinbefore the small signal response is measured of the laser diode module according to FIG. 1 and FIG. 2. The laser diode LD used in this measurement is a 1.3 μm DCPBH (Double Channel Planar Buried Heterostructure) Fabry-Perot laser. A constant setting current is applied to this laser diode LD, on which current an alternating current having a relatively small amplitude is superimposed. The frequency of this alternating current is varied over a wide range from 10 MHz to 4 GHz. The optical power delivered by the laser diode LD to the glass fibre F is detected by means of a suitable photodiode which is coupled to the end of the glass fibre F which is located outside the module. (The photodiode PD of the module only needs to follow the rather slowly varying mean value of the optical power of the laser diode LD and will thus generally be much too slow for following the high-frequency variations of the optical power as occur during this type of measurement).

Figure 4:
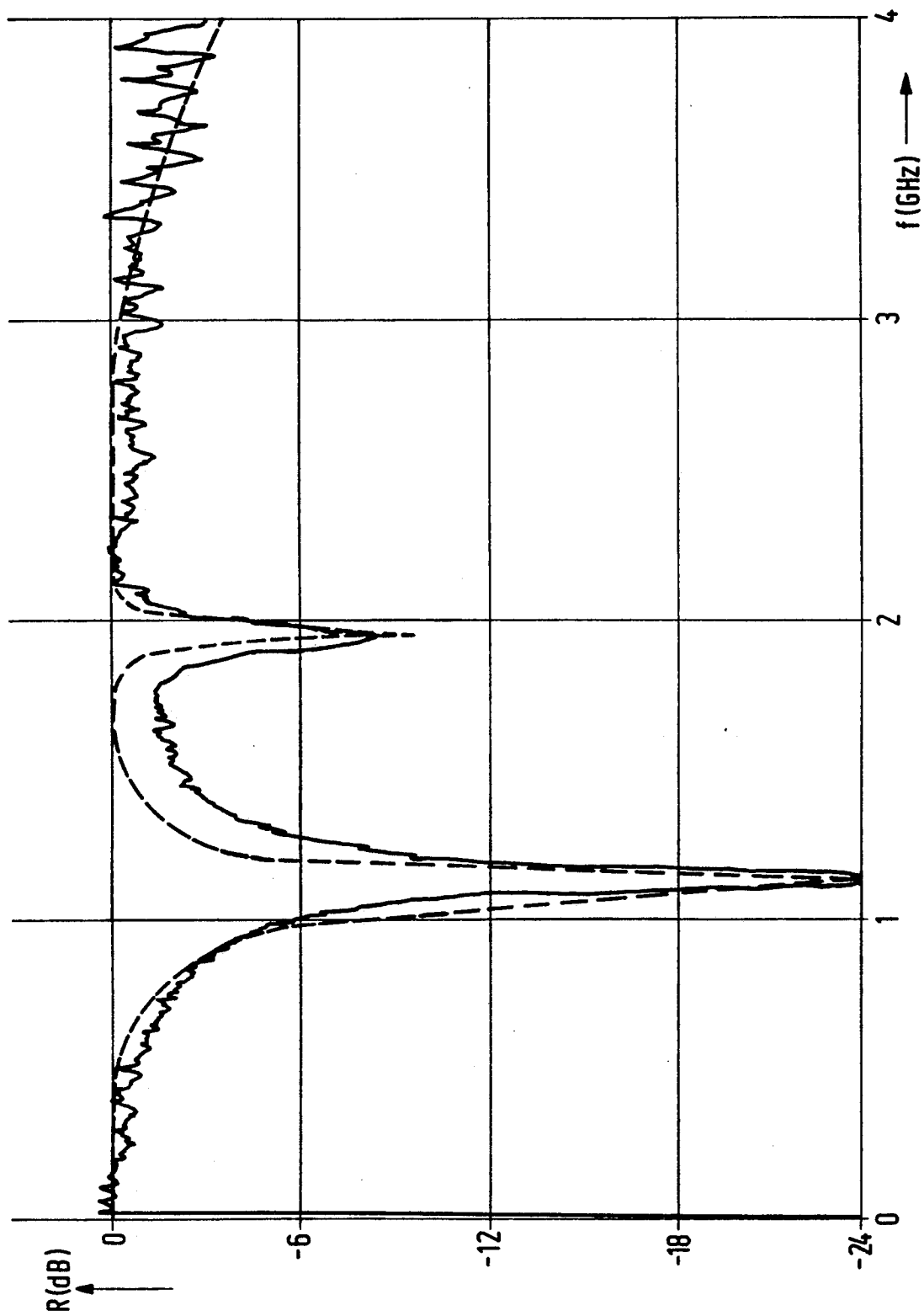
FIG. 4 shows a frequency diagram to illustrate the small signal response of the laser diode module of FIG. 1.

In the frequency diagram of FIG. 4 the measured small signal response R is plotted in dB against the frequency f in GHz for a laser diode of the type described hereinbefore with a setting current of 35 mA, and for a value of 42 ohms of the resistor CS to adapt the microstrip line to the characteristic impedance of 50 ohms. From FIG. 4 it appears that this small signal response R shows two dips viz. at the frequencies $f = 1.15$ GHz and $f = 1.95$ GHz.

The cause of these two dips can be explained with reference to the equivalent electric circuit of the laser diode module in the so-called free environment which is used during this measurement of the small signal response R. This equivalent electric circuit is represented in FIG. 5 and the structure of this circuit can be explained in the following manner.

The connecting wires from the pins 5 and 9 to the first sub-carrier $SC_1$ both consist of the series arrangement of three portions that form inductances: from the pins 5 and 9 portions located outside the casing and having respective inductances $Le_5$ and $Le_9$, from the pins 5 and 9 portions located inside the casing and having respective inductances $Li_5$ and $Li_9$, as well as a connecting wire between pin 5 and the base carrier BC having an inductance $Lb_5$ and a connecting wire between pin 9 and the electrical contact face on the top side of the insulating spacer of the sub-carrier $SC_1$ having an inductance $Lb_9$. The pin 5 is electroconductively connected to the bottom B of the casing which, even at relatively high frequencies, may still be considered a conductor having negligible impedance and which is therefore represented in FIG. 5 as a bold line connected to the junction point of the inductances $Le_5$ and $Li_5$. On the other hand, pin 9 is led through the bottom B by means of a feedthrough insulator which forms a capacitance $Ct_9$ between the junction point of the inductances $Le_9$ and $Li_9$ and the bottom B.

Figure 5:
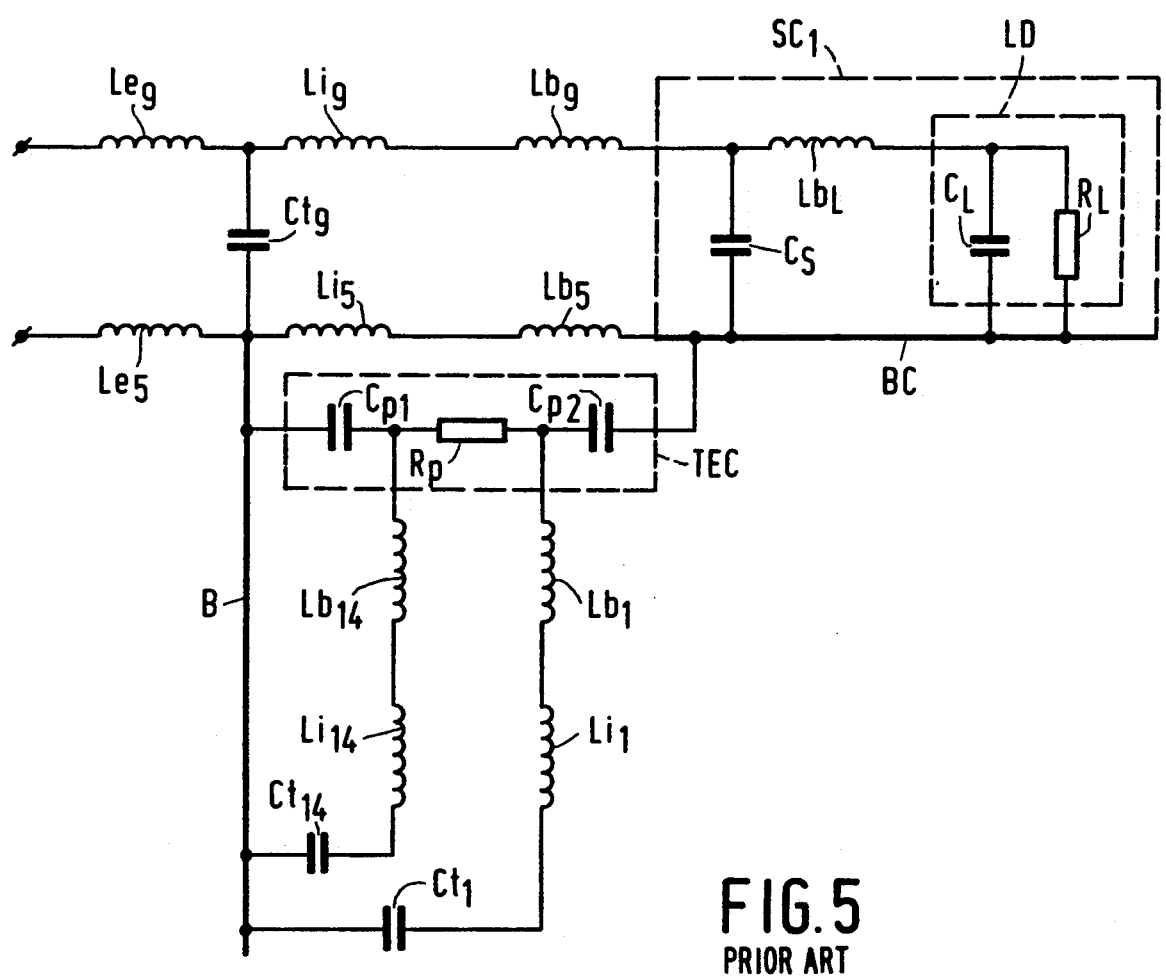
FIG. 5 shows an equivalent circuit diagram of the laser diode module of FIG. 1.

The base carrier BC may also be considered a conductor which also at relatively high frequencies still has a negligible impedance and which is therefore represented in FIG. 5 as a bold line connected to the series arrangement of the inductances $Le_5$, $Li_5$ and $Lb_5$. The laser diode LD arranged on the first sub-carrier $SC_1$ may initially be modelled as the parallel arrangement of a capacitor $C_L$ and a resistor $R_L$, one end of the parallel arrangement in FIG. 5 being connected to the line BC, because the impedance of the conductive connection between the anode of laser diode LD and base carrier BC via the metal part of the sub-carrier SC may still be neglected even at relatively high frequencies. The wire between the cathode of laser diode LD and the electrical contact face on the top side of the insulating spacer of sub-carrier $SC_1$ forms an inductance $Lb_L$, and this insulating spacer between the contact face and the metal portion of sub-carrier $SC_1$ forms a capacitance $C_S$ between the junction point of the inductances $Lb_L$ and $Lb_9$ and the base carrier BC.

The parasitic reactances of the Peltier cooler TEC, which is located between the base carrier BC and the bottom B of the casing, can be represented in good approximation by the series arrangement of a capacitor $C_{p1}$, a resistor $R_p$ and a capacitor $C_{p2}$. The connecting lines from the Peltier cooler TEC to the pins 1 and 14 both consist of a series arrangement of two inductance-forming portions: one connecting line between the connecting points of the Peltier cooler TEC and the pins 1 and 14 having respective inductances $Lb_1$ and $Lb_{14}$ which are coupled to respective end connecting points of the resistor $R_p$ (which is representative of the resistance of the series-arranged p-n junctions in the Peltier cooler TEC), as well as portions of the pins 1 and 14 having respective inductances $Li_1$ and $Li_{14}$ which portions are located inside the casing. In this context the portions located outside the casing do not play any role because these pins 1 and 14 in the afore-described free environment are not connected to guide tracks of the printed circuit board (compare FIG. 3). On the other hand, the feedthrough insulators in the bottom B for the pins 1 and 14 do play a role because these feedthrough insulators form respective capacitances $Ct_1$ and $Ct_{14}$ between the bottom B and the end connecting points of the respective series arrangements of the inductances $Li_1$, $Lb_1$ and $Li_{14}$, $Lb_{14}$.

The values of the circuit elements shown in FIG. 5 are represented in the Table below. These values are obtained from computations and/or impedance measurements of the module in the described free environment.

| | |
|---|---|
| $Le_5$, $Le_9$ | 1 nH |
| $Li_5$, $Li_9$; $Li_1$, $Li_{14}$ | 3 nH |
| $Lb_5$, $Lb_9$ | 2 nH |
| $Lb_1$, $Lb_{14}$ | 10 nH |
| $Lb_L$ | 0.8 nH |
| $Ct_9$, $Ct_{14}$ | 0.6 pF |
| $C_S$ | 0.2 pF |
| $C_L$ | 5 pF |
| $R_L$ | 6 ohms |
| $C_{p1}$, $C_{p2}$ | 7.6 pF |
| $R_p$ | 0.3 ohm |

In the design of the laser diode LD used in FIG. 5 the optical signal of the laser diode LD is proportional to the current flowing through the resistor $R_L$. The computed (small signal) response R of this current through resistor $R_L$ as a function of the frequency f is also represented in FIG. 4, that is to say by means of a dashed line. From FIG. 4 it appears that the high-frequency electrical behaviour of the laser diode module in a free environment can indeed be represented in a good approximation by the equivalent electric circuit of FIG. 5, despite the rather simple designs that are used for the derivation from this circuit structure.

The two sharp dips shown by the responses R in FIG. 4 at the frequencies f=1.15 GHz and f=1.95 GHz, can be associated with resonance phenomena in the circuit of FIG. 5. More specifically, the dip at f=1.15 GHz is associated with a parallel resonance between the inductances $Li_5$, $Lb_6$ and the capacitances $C_{p1}$, $C_{p2}$, whereas the dip at f=1.95 GHz can be associated with a combination of series-resonance phenomena between the inductances $Lb_1$, $Li_1$ and the capacitance $Ct_1$, the inductances $Lb_{14}$, $Li_{14}$ and the capacitance $Ct_{14}$ respectively, whilst the capacitance $C_{p1}$, as it is arranged in parallel with the respective series arrangements ($Lb_{14}$, $Li_{14}$, $Ct_{14}$) and ($Lb_1$, $Li_1$, $Ct_1$), is to be taken account of.

It will be evident that also in the case of a laser diode module in a practical environment (in which, in addition to the pins 5, 9 and 10 also the remaining pins 1-4, 6-8 and 11-14 are connected to the guide tracks on a printed circuit board), an equivalent electric circuit can be derived in the same way as the circuit of FIG. 5 is derived in the case of a laser diode module in a free environment according to FIG. 3. It will further be evident that in this practical case the small signal response R will show considerably more dips than the two in FIG. 4 and that these dips can also be associated with resonance phenomena in the equivalent electric circuit, whilst the parasitic reactances of the thermoelectric cooler TEC continue to play a role.

However, in accordance with the invention the effect of the thermoelectric cooler TEC can be considerably reduced by means of a slight modification of the existing casing of the laser diode module, as a result of which this slightly modified module is rendered suitable for use in systems having considerably higher bit rates than is possible with the existing module.

Figure 6:
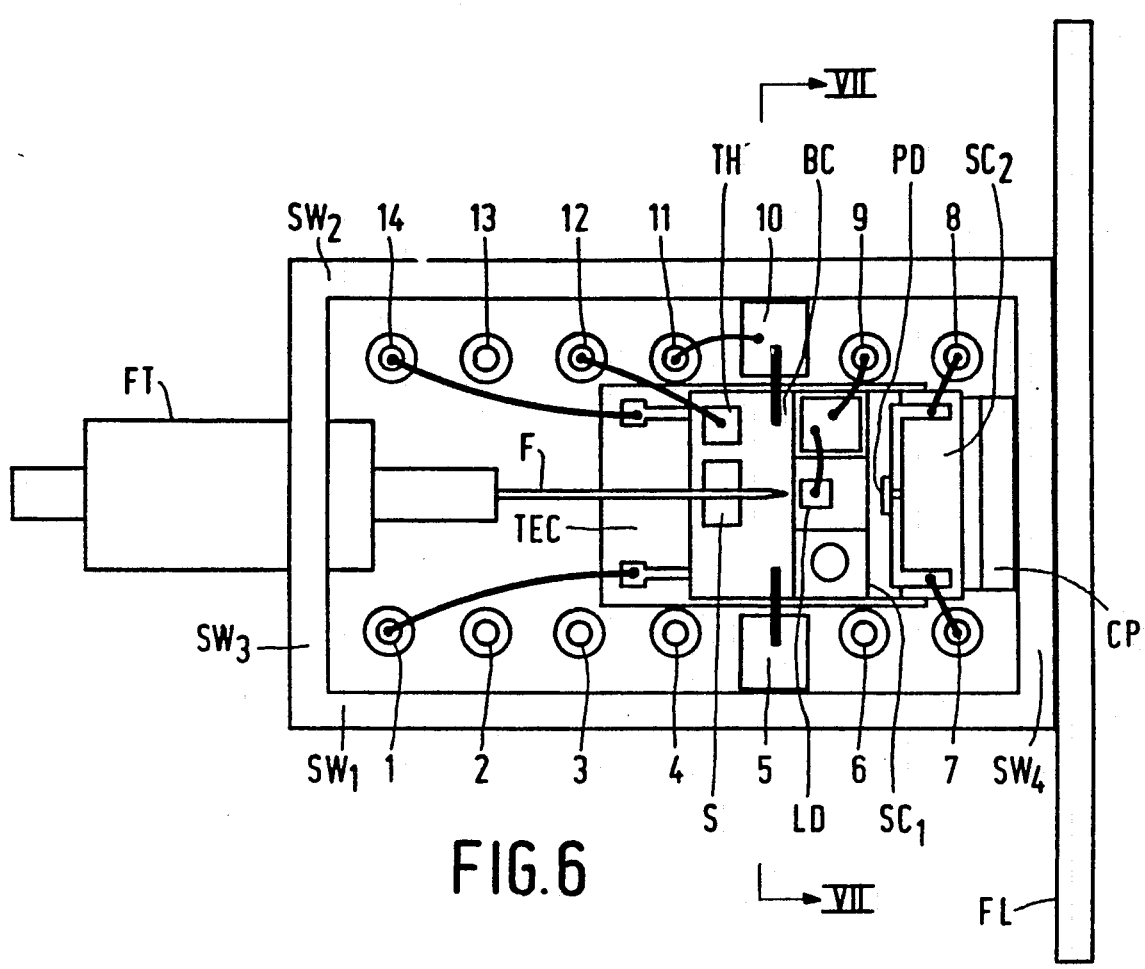
FIG. 6 shows a top view of an embodiment for a laser diode module according to the invention.
Figure 7:
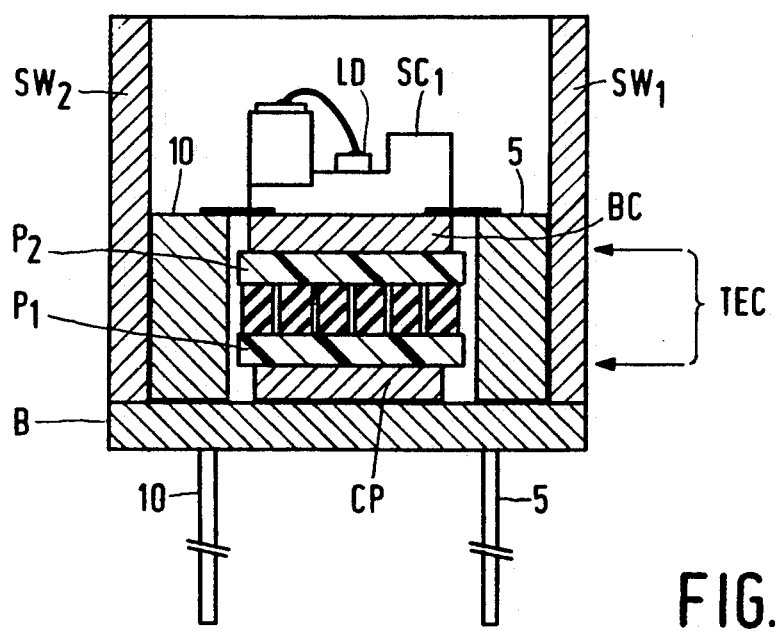
FIG. 7 shows a cross-section of the same laser diode module along line VII—VII in FIG. 6.

An embodiment for a laser diode module according to the invention is shown in FIG. 6 and FIG. 7, FIG. 6 showing a simplified plan view and FIG. 7 a simplified sectional view along the line VII-VII in FIG. 6. Corresponding elements in FIG. 1, FIG. 2, FIG. 6 and FIG. 7 are designated by the same reference numerals.

The laser diode module as shown in FIG. 6 and FIG. 7 differs from the laser diode module as shown in FIG. 1 and FIG. 2 with respect to the guide pins 5 and 10, which are electroconductively connected to the bottom B of the casing. According to the invention these pins 5 and 10 have a portion located inside the casing which portion has the form of a rod having a constant cross-section and at least one flat side face which is connected electroconductively over its entire surface to the relevant long sidewalls $SW_1$ and $SW_2$ respectively, of the metal casing, whereas an electroconductive connection is realised between the head face of each of the two rod-like portions of the pins 5, 10 and the metal base carrier BC. Owing to this measure the inductance of the portions of pins 5 and 10 located within the casing is reduced considerably and hence also the inductance of the connection between the casing and the base carrier BC of the module.

The equivalent electric circuit for the small signal response of the laser diode module modified thus, again corresponds with the circuit according to FIG. 5 in the case of a module in a free environment according to FIG. 3, however with the exception that the inductance $Li_5$ is considerably reduced owing to the measure described hereinbefore, so that the parallel resonance between the inductances $Li_5$, $Lb_5$ and the parasitic reactances $C_{p1}$, $C_{p2}$ of the thermoelectric cooler TEC will occur at a much higher frequency than f=1.15 GHz.

In the embodiment of FIG. 6 and FIG. 7 the length of the rod-like portions of the pins 5 and 10 is chosen to be substantially equal to the distance between the bottom B of the casing and the top of the base carrier BC as shown in FIG. 7, so that a relatively short electrical connection between the head face of each of the rod-like portions of the pins 5, 10 and the metal base carrier of the rod-like portions of the pins 5, 10 and the metal base carrier BC will suffice, as a result of which not only the inductance $Li_5$ but also the inductance $Lb_5$ in FIG. 5 is diminished and thus the parallel resonance between these inductances and the parasitic reactances $C_{p1}$, $C_{p2}$ of the thermoelectric cooler TEC will be moved towards higher frequencies. A further diminishing of this inductance Lb$_5$ is attained in the embodiment of FIG. 6 and FIG. 7 by selecting the dimensions of the rod-like portions of the pins 5, 10 in the direction perpendicular to the relevant sidewalls SW$_1$, SW$_2$ slightly smaller than the distance between the sidewalls SW$_1$, SW$_2$ and the facing sides of the base carrier BC and, in addition, by not bridging the interstices developed thus between the base carrier BC and the rod-like portions of the pins 5, 10 by means of a connecting wire but by means of a relatively wide connecting strip, as represented in FIG. 6. However, it is to be recommended not to choose too large a thickness for this connecting strip in order to avoid an undersirable thermal coupling to develop between the metal base carrier BC and the sidewall SW$_1$, SW$_2$ of the metal casing by means of this connecting strip.

The rod-like portion of the pins 5 and 10 preferably has a rectangular cross-section, as shown in FIG. 6, so that this portion can be manufactured in a simple manner and attached to the relevant sidewall SW$_1$, SW$_2$. In this case the dimension of the rod-like portion of the pins 5 and 10 in a direction in parallel with the lines (1–7), (8–14) of the DIL order is approximately equal to the smallest distance between two consecutive further pins in these lines in order to avoid undesirable couplings between the rod-like portions of the pins 5 and 10 and their respective adjacent pins 4, 6 and 9, 11.

The frequency diagram in FIG. 8 shows, in a manner equal to that of FIG. 4, the small signal responses R of the modified laser diode module according to FIG. 6 and FIG. 7 in the same free environment conditions as were applicable to the original laser diode module according to FIG. 1 and FIG. 2, so that the effect of the modified casing can be distinctly shown. As was expected on the basis of the foregoing, the sharp dip in the response R, which can be associated with the parallel resonance between the inductances Li$_5$, Lb$_5$ and the parasitic reactances C$_{p1}$, C$_{p2}$ of the thermoelectric cooler TEC is found in FIG. 8 for the modified casing at a frequency having a value of f=2.9 GHz, which is much higher than the value f=1.15 GHz found in FIG. 4 for the original casing. The second sharp dip in the response R of FIG. 4, which can be associated with series resonance phenomena between the inductances Lb$_1$, Li$_1$ and Lb$_{14}$, Li$_{14}$ of the conducting wires to the thermoelectric cooler TEC and the associated capacitances Ct$_1$ and Ct$_{14}$ of the feedthrough insulators in the bottom B, is no longer found to an appreciable extent in the measured response R of FIG. 8 for the modified casing. This second dip, however, is still present in the computed response R of FIG. 8, but to a less pronounced extent than in FIG. 4. A possible explanation of this difference between the measured and computed response R in FIG. 8 is the weaker coupling between the inductances Li$_5$, Lb$_5$ and the parasitic reactances C$_{p1}$, C$_{p2}$ of the thermoelectric cooler TEC (since these inductances are now much smaller and, in addition, pin 5 as well as pin 10 are electroconductively connected to the base carrier BC, so that the computation of the response R in FIG. 8, the sum of these inductances Li$_5$+Lb$_5$ in FIG. 5, has now a value of 0.8 nH in lieu of the value of 5 nH in the case of FIG. 4), and also the fact that the connecting lines to this cooler TEC are rather long and run more or less parallel with the sidewalls SW$_1$, SW$_2$ and the bottom B of the casing, so that a distributed LC network is a better model for these lines than the series arrangement of two inductances as implemented in FIG. 5.

From the measured response R of FIG. 8 it may be concluded that also for the laser diode module of FIG. 6 and FIG. 7 in a practical environment it will hold that undesirable resonances which are caused by the coupling between the parasitic reactances of the thermoelectric cooler and the relatively high inductances of several connecting lines within the module casing, as a consequence of the simple measure according to the invention, are either shifted towards considerably higher frequencies or weakened to such an extent that they are no longer perceptible in practice.

From FIG. 8 it follows that the small signal response R has a −3 dB bandwidth of approximately 2.5 GHz, that is to say a value which is approximately three times as large as that in FIG. 4 for the original module. From this it may be inferred that the modification of the original casing to be introduced in a simple manner renders the laser diode module now suitable for use in optical communication systems having bit rates up to 4 Gbit/s. This inference is confirmed by the results of the measurements of the (large-signal) pulse response of the laser diode module, which measurements were carried out with the aid of an NRZ data signal (Non-Return-to-Zero) which is formed by a periodic pseudo random bit series having a period length of $(2^{23}-1)$ bits. From these measurements it appears that also at a bit rate of 4 Gbit/s the data signal at the output of the laser diode module has an eye pattern having an eye opening of which the dimensions are amply sufficient to guarantee a reliable transfer of this data signal through the optical glass fibre.

For completeness it should be observed that in FIG. 8 the measured response R of the laser diode module and the computed response R of the equivalent electric circuit show a distinct discrepancy for the frequencies from approximately 3 GHz onwards. This discrepancy for the higher frequencies is caused by the fact that at these frequencies the laser diode can no longer be represented sufficiently accurately by the extremely simple structure of the parallel arrangement of a capacitor and a resistor as is used in the equivalent electric circuit of FIG. 5. From the description hereinbefore, however, it appears that the equivalent electric circuit of FIG. 5 has a structure which is extremely suitable for representing in an accurate way the high-frequency electrical behaviour of the laser diode module as a whole.

We claim:

1. A laser diode module comprising:
    a rectangular box-like metal casing with a bottom, two long and two short sidewalls, a tubular passage for a glass fibre being provided in one of the short sidewalls, and no less than eight guide pins being passed through the bottom in a standardized DIL order, no less than one of the guide pins being inserted in the bottom by means of electrically conducting material and the remaining guide pins being inserted in the bottom by means of feedthrough insulators;
    a thermoelectric cooler having two thermal contact pads, one contact pad being thermoconductively coupled to the bottom of the metal casing;
    a plate-formed metal base carrier which is thermoconductively connected to the other thermal contact pad of the thermoelectric cooler, this base carrier accommodating:
    a first sub-carrier with a laser diode attached, a second sub-carrier with a photodiode attached, a support for arranging the glass fibre such that its end is facing the front facet of the laser diode, and a thermistor thermally coupled with the base carrier; and connecting lines for electrically connecting the laser diode, the photodiode, the thermistor, the thermoelectric cooler and the metal base carrier to the respective guide pins;

wherein no less than one of the guide pins, electroconductively connected to the bottom, has a portion located inside the casing which portion has the form of a rod which over its entire length is electroconductively connected to the associated long sidewall of the casing, an electroconductive coupling being provided between the head face of the rod and the base carrier.

2. A laser diode module as claimed in claim 1, wherein the rod has a constant cross section and no less than one flat side face which is electroconductively connected over its entire surface to the associated long sidewall of the casing.

3. A laser diode module as claimed in claim 1, wherein the length of the rod is substantially equal to the distance between the bottom of the casing and the top of the base carrier.

4. A laser diode module as claimed in claim 3, wherein the largest rod dimension in the direction perpendicular to the associated long sidewall of the casing is smaller than but substantially equal to the distance between this sidewall and the facing side of the base carrier.

5. A laser diode module as claimed in claim 3, wherein the electroconductive coupling between the head face of the rod and the base carrier has the form of a relatively wide connecting strip.

6. A laser diode module as claimed in claim 1, wherein the rod has a substantially rectangular cross-section.

7. A laser diode module as claimed in claim 6, wherein the width of the flat rod side face which is connected to the sidewall is substantially equal to the smallest distance between two consecutive further guide pins in a line of the aforementioned DIL order.

8. A housing for a laser diode comprising:
(a) a rectangular box-like metal casing with a bottom, two long and two short sidewalls, a tubular passage for a glass fiber being provided in one of the short sidewalls, and a plurality of guide pins being passed through the bottom, at least one of the guide pins being inserted in the bottom by means of electrically conducting material and the remaining guide pins being inserted in the bottom by means of feed-through insulators;
(b) a thermoelectric cooler having two thermal contact pads, one contact pad being thermoconductively coupled to the bottom of the metal casing;
(c) a plate-like metal base carrier which is thermoconductively connected to the other thermal contact pad of the thermoelectric cooler, this base carrier accommodating:
a first sub-carrier with a laser diode attached,
a second sub-carrier with a photodiode attached,
a support for arranging the glass fiber such that its end is facing the front facet of the laser diode,
a thermistor thermally coupled with the base carrier;
(d) connecting means for electrically connecting the the laser diode, the photodiode, the thermistor, the thermoelectric cooler and the metal base carrier to their respective guide pins; and
(e) at least one of the guide pins, electroconductively connected to the bottom, has a portion located inside the casing which portion has the form of a rod which over its entire length is electroconductively connected to the associated long sidewall of the casing, and an electroconductive coupling being provided between the head face of the rod and the base carrier.

9. A casing as claimed in claim 8, wherein the rod comprises a constant cross section and no less than one flat side face which is electroconductively connected over its entire surface to the associated long sidewall of the casing.

10. A casing as claimed in claim 8, wherein the length of the rod is substantially equal to the distance between the bottom of the casing and the top of a base carrier of a laser diode module with a thermoelectric cooler which base carrier is to be arranged inside the casing.

11. A casing as claimed in claim 10, wherein the largest dimension of the rod in the direction perpendicular to the long sidewall of the casing is smaller than but substantially equal to the distance between this sidewall and the facing side of the said base carrier to be arranged inside the casing.

12. A casing as claimed in claim 8, wherein the rod has a substantially rectangular cross-section.

13. A casing as claimed in claim 12, wherein the width of the flat rod side face connected to the sidewall is substantially equal to the smallest distance between two consecutive guide pin.

14. A housing for a laser diode comprising:
(a) a rectangular box-like metal casing with a bottom, two long and two short sidewalls, a tubular passage for a glass fiber being provided in one of the short sidewalls, and a plurality of guide pins being passed through the bottom, at least one of the guide pins being inserted in the bottom by means of electrically conducting material and the remaining guide pins being inserted in the bottom by means of feed-through insulators; and
(b) at least one of the guide pins, electroconductivly connected to the bottom, having a poriton located inside the casing which portion is in the form of a rod which over its entire length is electroconductivly connected to the associated long sidewall of the casing.

15. A housing as claimed in claim 14, wherein the rod comprises a constant cross section and no less than one flat side face which is electroconductivly connected over its entire surface to the associated long sidewall of the casing.

16. A housing as claimed in claim 14, wherein the length of the rod is substantially equal to the distance between the bottom of the casing and the top of a base carrier of a laser diode module with a thermoelectric cooler whose base carrier is to be arranged inside the casing.

17. A housing as claimed in claim 16, wherein the largest dimension of the rod in the direction perpendicular to the long sidewall of the casing is smaller than but substantially equal to the distance between this sidewall and the facing side of the said base carrier to be arranged inside the casing.

18. A housing as claimed in claim 14, wherein the rod has a substantially rectangular cross-section.

19. A housing as claimed in claim 15, wherein the width of the flat rod side face connected to the sidewall is substantially equal to the smallest distance between two consecutive guide pins.

* * * * *